(12) United States Patent
Lee et al.

(10) Patent No.: US 7,598,141 B2
(45) Date of Patent: Oct. 6, 2009

(54) METHOD OF FABRICATING STATIC RANDOM ACCESS MEMORY

(75) Inventors: Chang-Hoon Lee, Seoul (KR); Sang-Jin Park, Gyeonggi-do (KR); Won-Seok Yoo, Gyeonggi-do (KR); Kong-Soo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 204 days.

(21) Appl. No.: 11/261,266

(22) Filed: Oct. 28, 2005

(65) Prior Publication Data

US 2006/0108575 A1    May 25, 2006

(30) Foreign Application Priority Data

Nov. 23, 2004    (KR) ...................... 10-2004-0096168

(51) Int. Cl.
*H01L 21/336* (2006.01)

(52) U.S. Cl. .................. 438/269; 438/201; 438/211; 438/257; 257/E27.098; 257/E21.661

(58) Field of Classification Search ................ 438/341, 438/269, 149, 309, 201, 211, 257; 257/E27.098, 257/E21.661
See application file for complete search history.

(56) References Cited

U.S. PATENT DOCUMENTS

| 5,166,767 | A | * | 11/1992 | Kapoor et al. ............... 257/518 |
| 5,818,069 | A | | 10/1998 | Kadosh et al. |
| 5,852,310 | A | | 12/1998 | Kadosh et al. |

OTHER PUBLICATIONS

Wolf et al. "Silicon Processing for the VLSI ERA", 1986, vol. 1, pp. 179.*

* cited by examiner

*Primary Examiner*—Thanh Nguyen
(74) *Attorney, Agent, or Firm*—Marger Johnson & McCollom, P.C.

(57) ABSTRACT

A method of fabricating a static random access memory device includes selectively removing an insulating film and growing a single crystalline silicon layer using selective epitaxy growth, the single crystalline silicon layer being grown in a portion from which the insulating film is removed; recessing the insulating film; and depositing an amorphous silicon layer on the single crystalline silicon layer and the insulating film, such that the amorphous silicon layer partially surrounds a top surface and side surfaces of the single crystalline silicon layer.

10 Claims, 9 Drawing Sheets

METHOD OF FABRICATING STATIC RANDOM ACCESS MEMORY

CROSS-REFERENCE TO RELATED APPLICATIONS

This application claims priority from Korean Patent Application No. 10-2004-0096168, filed on 23 Nov. 2004, the content of which is incorporated by reference in its entirety for all purposes.

BACKGROUND

1. Technical Field

This disclosure relates to a method of fabricating semiconductor memory devices, and more particularly, to a method of fabricating static random access memory devices.

2. Discussion of Related Art

Generally, static random access memories (SRAMs) have been widely used in a field of middle-or small-sized computers because the memories operate at a high speed despite lower integration compared to dynamic random access memories (DRAMs). A conventional SRAM cell is typically composed of a flip flop circuit that includes two transfer transistors, two driver transistors, and two load elements. Information is represented as a difference in voltage between the input and output terminals of the flip flop, i.e., charges accumulated on a node of the cell. The charges are always supplemented via a PMOS transistor or a load resistor as a load element from power supply voltage (Vcc), and thus, unlike DRAMS, SRAMs need not have a refresh function.

SRAM memory cells may be further classified as either high-resistance cells that utilize a high resistance load element or as Complementary Metal Oxide Semiconductor (CMOS) cells that utilize a P-channel Metal Oxide Semiconductor (PMOS) transistor as the load element.

CMOS cells may be further classified as either thin film transistor cells that utilize a thin film transistor as the load element or as complete CMOS cells that utilize a bulk transistor as the load element.

FIG. 1 is a circuit diagram illustrating a conventional CMOS cell.

Referring to FIG. 1, the CMOS cell 100 is composed of a pair of driver transistors TD1 and TD2, a pair of transfer transistors TA1 and TA2, and a pair of load transistors TL1 and TL2. The driver transistors TD1 and TD2 and the transfer transistors TA1 and TA2 are N-channel Metal Oxide Semiconductor (NMOS) transistors while the load transistors TL1 and TL2 are both PMOS transistors.

The first driver transistor TD1 and the first transfer transistor TA1 are connected in series. A source region of the first driver transistor TD1 is connected to a ground line Vss and a drain region of the first transfer transistor TA1 is connected to a first bit line BL.

Similarly, the second driver transistor TD2 and the second transfer transistor TA2 are connected in series. A source region of the second driver transistor TD2 is connected to the ground line Vss and a drain region of the second transfer transistor TA2 is connected to a second bit line /BL. The first and second bit lines BL and /BL carry opposite information. That is, if the BL is at logic "1," /BL is at logic "0."

A source region of the first load transistor TL1 is connected to a power line Vcc. A drain region of the first load transistor is connected to a drain region of the first driver transistor TD1. In other words, the drains of the transistors TL1 and TD1 share a common first node.

Similarly, a source region of the second load transistor TL2 is connected to the power line Vcc and a drain region of the second load transistor is connected to a drain region of the second driver transistor TD2. In other words, the drains of the transistors TL2 and TD2 share a common second node.

A gate electrode of the first driver transistor TD1 and a gate electrode of the first load transistor TL1 are both connected to the second node. A gate electrode of the second driver transistor TD2 and a gate electrode of the second load transistor TL2 are both connected to the first node. In addition, gate electrodes of the first and second transfer transistors TA1 and TA2 are connected to a word line WL.

SRAMs may often be multi-layered to achieve high integration of semiconductor devices.

FIGS. 2A-2D are sectional diagrams illustrating a conventional method of fabricating an SRAM.

Referring to FIG. 2A, a conductive layer (not shown) is deposited on a semiconductor substrate 1. A gate line 2 is formed using by performing a photolithographic process on the conductive layer. An insulating sidewall 3 is then formed on a side surface of the gate line 2 using an etch back process.

A first insulating film 4 is formed on surface of the semiconductor substrate and on the gate line 2, and then a first interlayer insulating film 5 is formed on the first insulating film 4. The first insulating film 4 prevents diffusion of impurities in a device, such as an SRAM, and may also be used as an etch stopping layer in an etching process. The first insulating film 4 is composed of SiOn or SiN. The first interlayer insulating film 5 is an interlayer dielectric (ILD) film (oxide film).

Photoresist is then deposited on the first interlayer insulating film 5. Using exposing and developing processes, a photoresist pattern PR is formed with a uniform interval.

As shown in FIG. 2B, the first interlayer insulating film 5 and the first insulating film 4 are selectively removed using the photoresist pattern PR as a mask.

As shown in FIG. 2C, using selective epitaxial growth (SEG), a single crystalline silicon layer 8 is grown in a region 7 defined by the photoresist pattern PR.

Pre-flow of silane ($SiH_4$) is carried out on the first interlayer insulating film 5 and the single crystalline silicon layer 8. This prevents a natural oxide film, such as silicon dioxide ($SiO_2$), from forming on the first interlayer insulating film 5 and the single crystalline silicon layer 8.

As shown in FIG. 2D, a process temperature is elevated to a predetermined temperature and then an amorphous silicon layer 9 is deposited on the first interlayer insulating film 5 and the single crystalline silicon layer 8 using a suitable method, e.g., sputtering, plasma enhanced chemical vapor deposition (PECVD), or low-pressure chemical vapor deposition (LPCVD). The amorphous silicon layer 9 is annealed in order to become crystallized. The single crystalline silicon layer 8 serves as a seed for crystallization of the amorphous silicon layer 9. The crystallized silicon layer serves as channel silicon.

Unfortunately, during the annealing of the amorphous silicon layer 9, a thinning phenomenon may occur such that the resulting crystallized silicon layer has a thinned profile in a region around the single crystalline silicon layer 8.

FIG. 3 is a photograph illustrating the thinning phenomenon in which the crystallized silicon layer has a thin profile in a region 11 around a single crystalline silicon layer. This reduction in thickness of the crystallized silicon layer is undesirable because the thinner portion of the silicon layer may be removed during subsequent processes.

Embodiments of the invention address these and other disadvantages of the conventional art.

SUMMARY

Embodiments of the invention may reduce the occurrence of a thinning phenomenon in a silicon layer by recessing the ILD and depositing an amorphous silicon layer at low temperature.

DETAILED DESCRIPTION

Preferred embodiments of the present invention will now be described more fully hereinafter with reference to the accompanying drawings. The invention may, however, also be embodied in different forms and should not be construed as limited to the embodiments set forth herein. Rather, these embodiments are provided as teaching examples of the invention. Like numbers refer to like elements.

According to embodiments of the invention, a first interlayer insulating film is recessed through etching and then an amorphous silicon layer is deposited on the first interlayer insulating film and a single crystalline silicon layer at low temperature.

FIGS. 4A-4E are sectional diagrams illustrating a method of fabricating an SRAM according to some embodiments of the invention.

Figure 1:
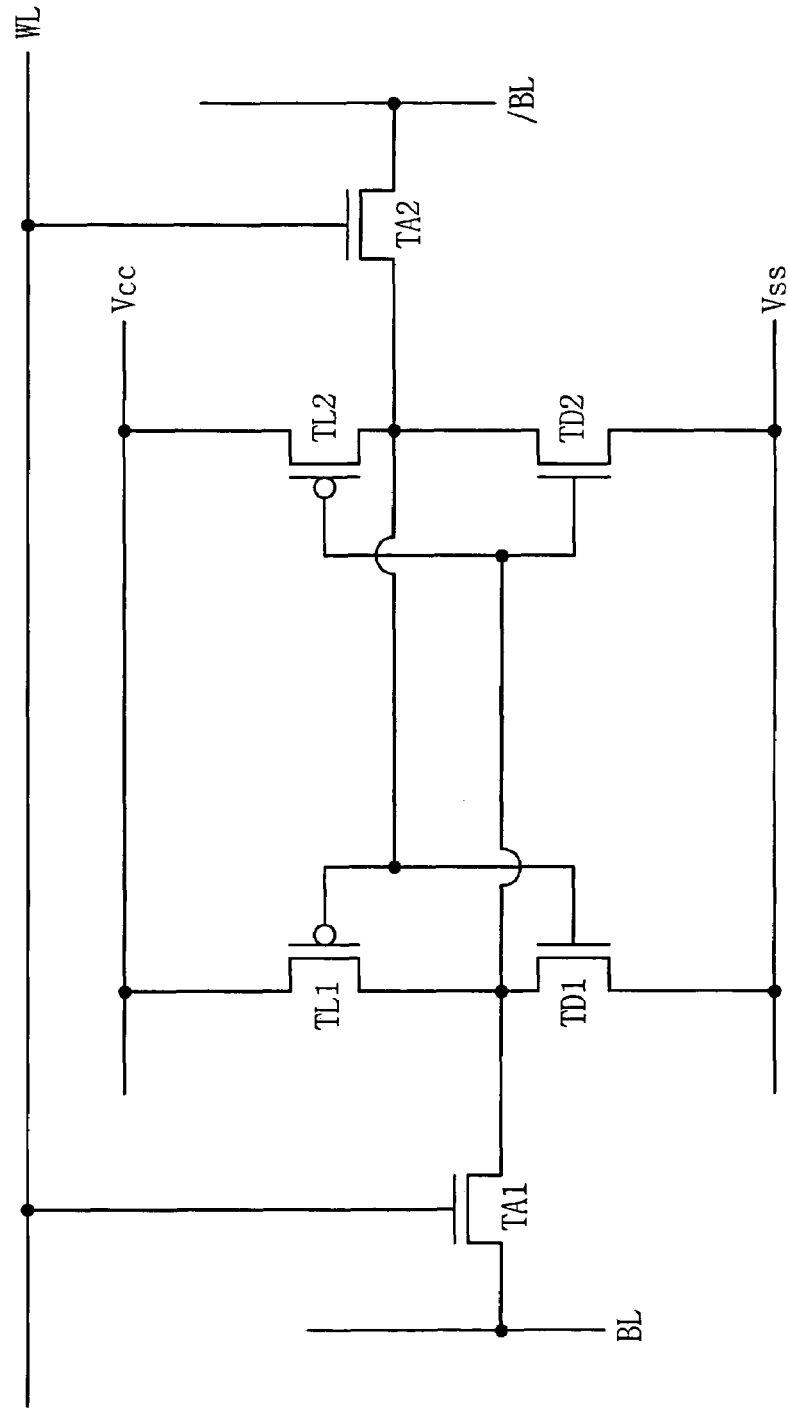
FIG. 1 is a circuit diagram illustrating a conventional CMOS cell.
Figure 2A:
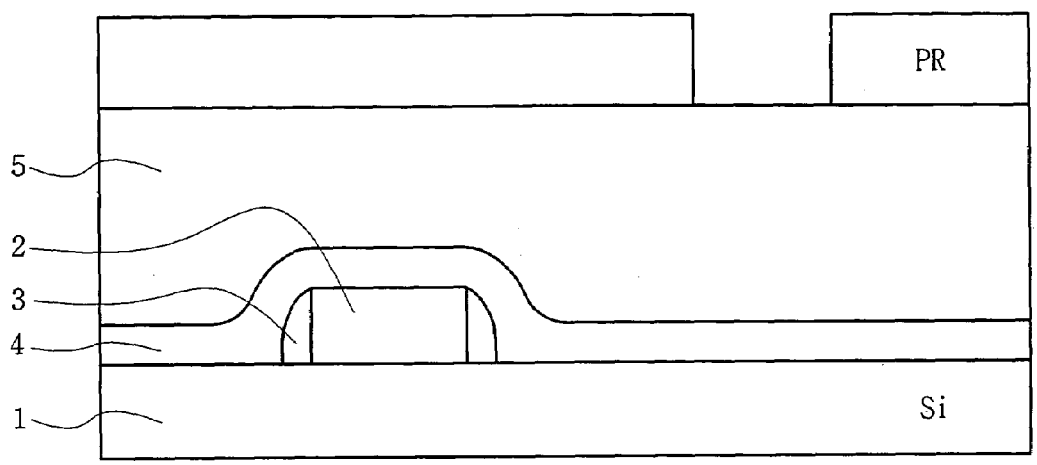
FIGS. 2A-2D are sectional diagrams illustrating a conventional method of fabricating an SRAM.
Figure 2B:
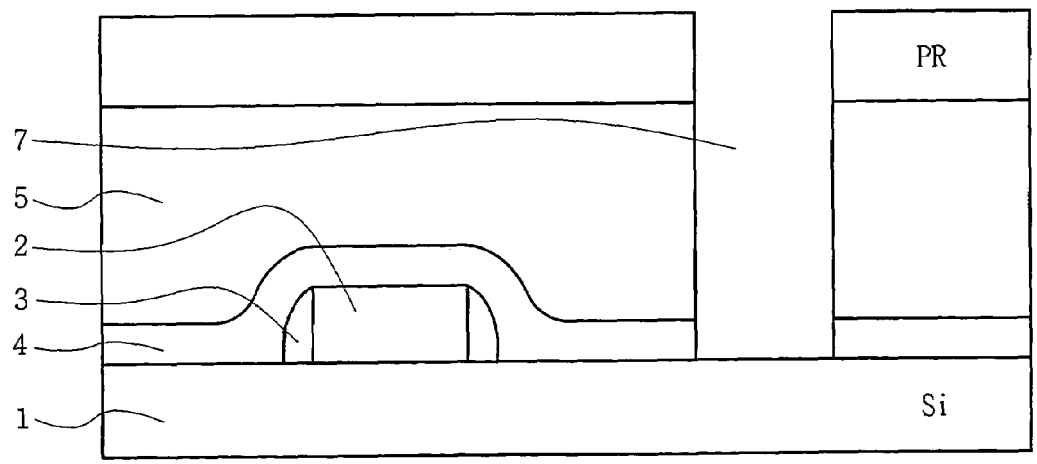
Figure 2C:
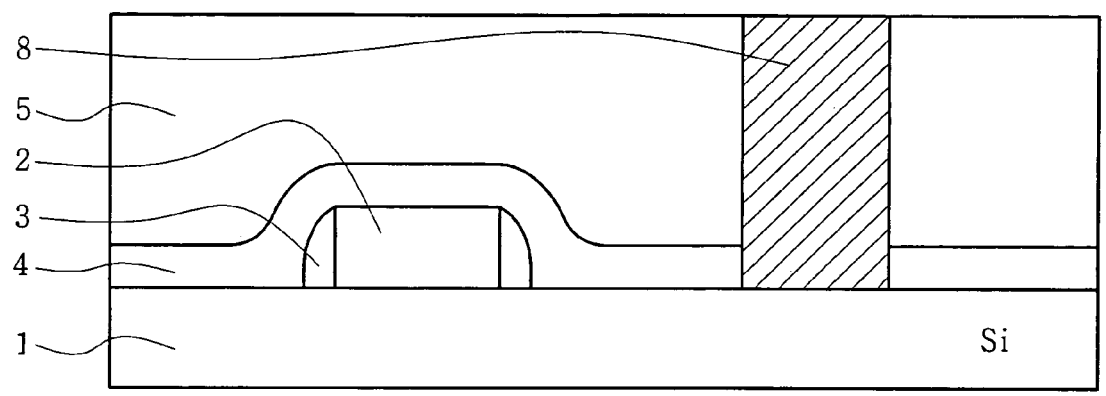
Figure 2D:
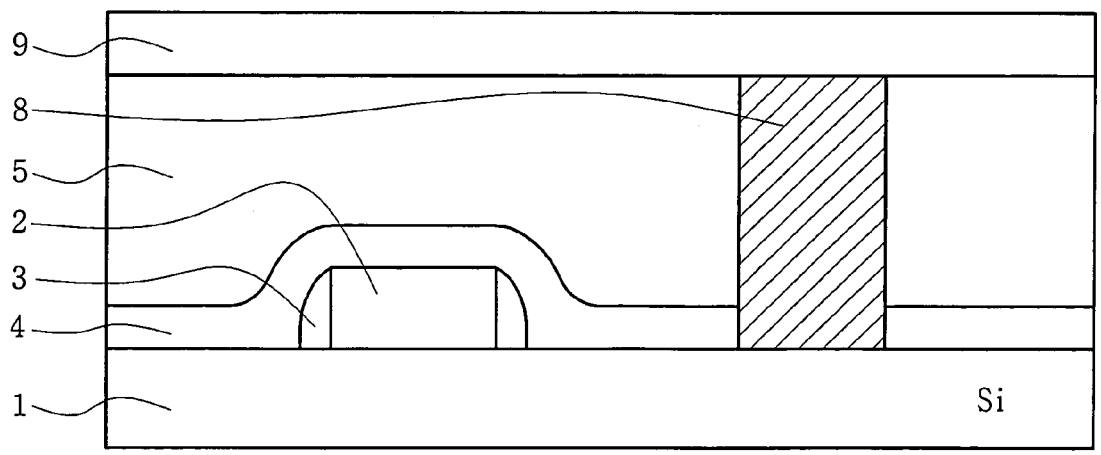
Figure 3:
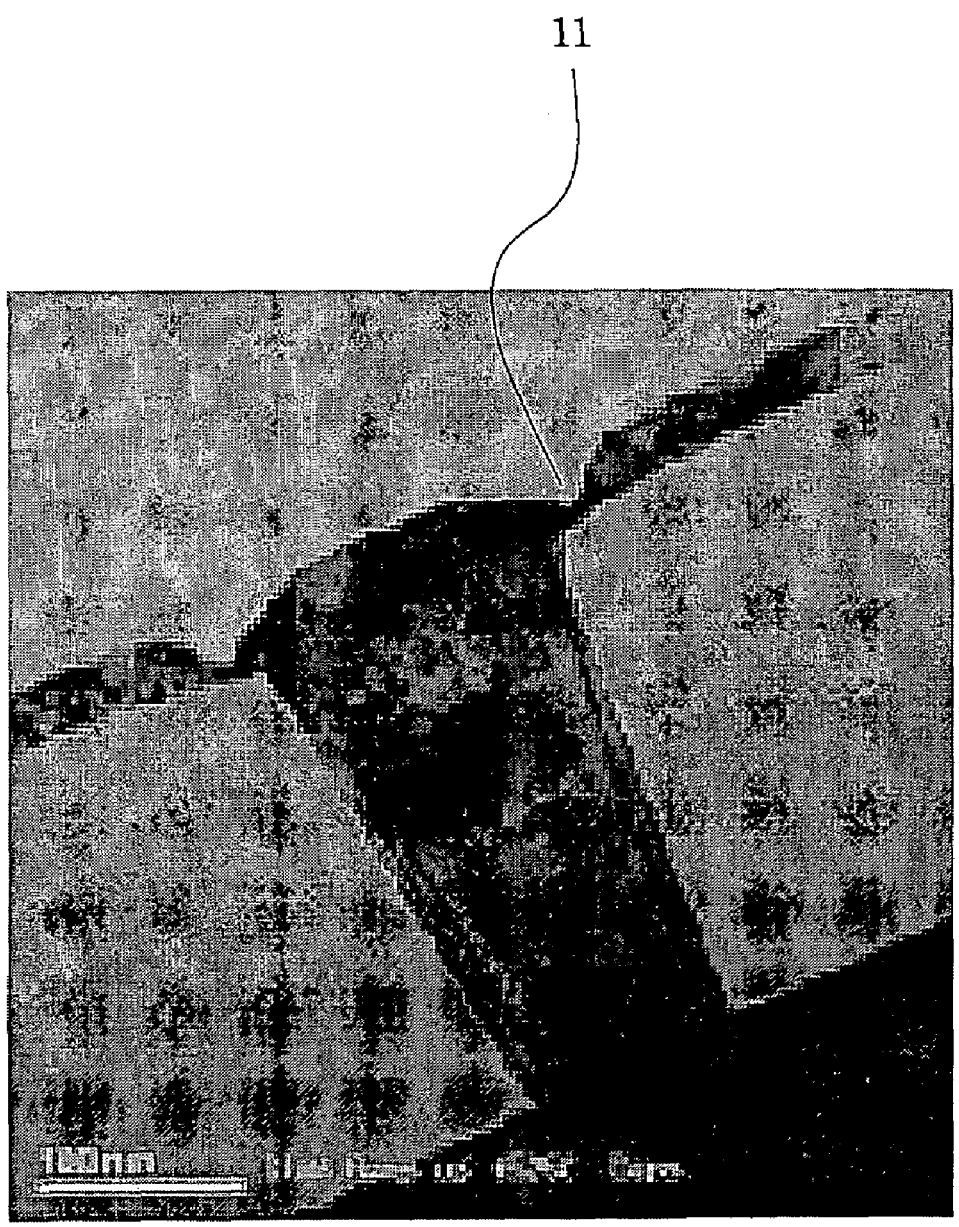
FIG. 3 is a photograph illustrating a thinning phenomenon resulting from the conventional method illustrated in FIGS. 2A-2D.
Figure 4A:
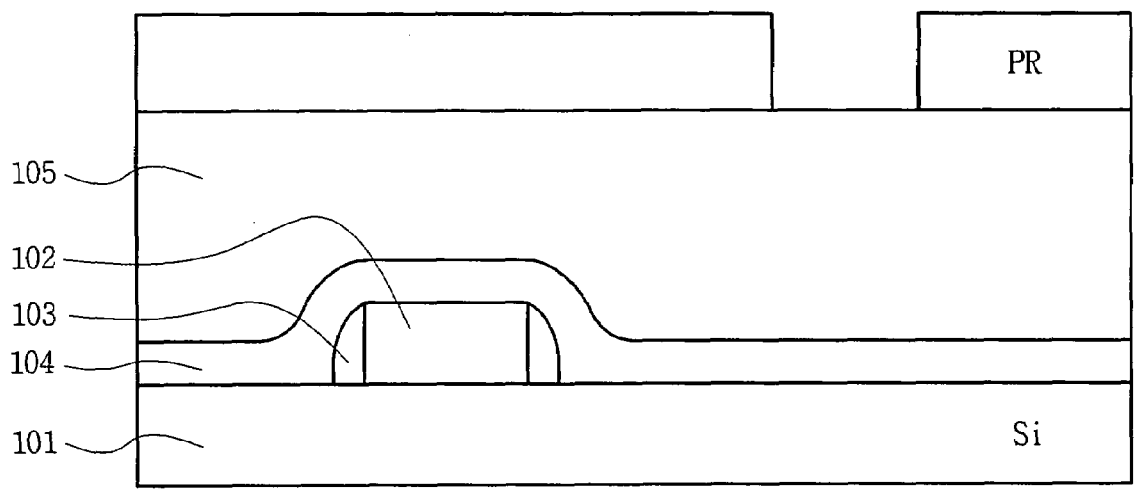
FIGS. 4A-4E are sectional diagrams illustrating a method of fabricating an SRAM according to some embodiments of the invention.

A shown in FIG. 4A, a conductive layer (not shown) is deposited on a semiconductor substrate 101. A gate line 102 is formed by performing a photolithographic process on the conductive layer. An insulating sidewall 103 is then formed on a side surface of the gate line 102 using an etch back process.

A first insulating film 104 is formed on a surface of the semiconductor substrate and on the gate line 102. A first interlayer insulating film 105 is formed on the first insulating film 104.

The first insulating film 104 may prevent diffusion of impurities in a device, such as an SRAM, and may also be used as an etching stopping layer in an etching process. The first insulating film 104 may be composed of SiON, SiN, or a similar material. The first interlayer insulating film 105 may be an interlayer dielectric (ILD) film that is composed of an oxide film.

Photoresist is then deposited on the first interlayer insulating film 105. Using exposing and developing processes, a photoresist pattern PR is formed with a uniform interval.

Figure 4B:
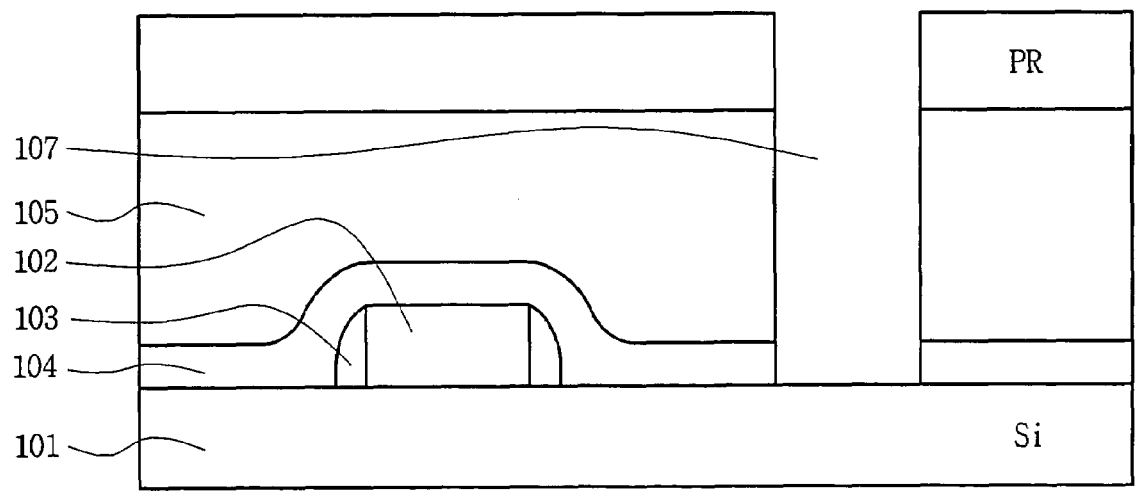

As shown in FIG. 4B, the first interlayer insulating film 105 is selectively removed using the photoresist pattern PR as a mask, so that a contact is formed.

Figure 4C:
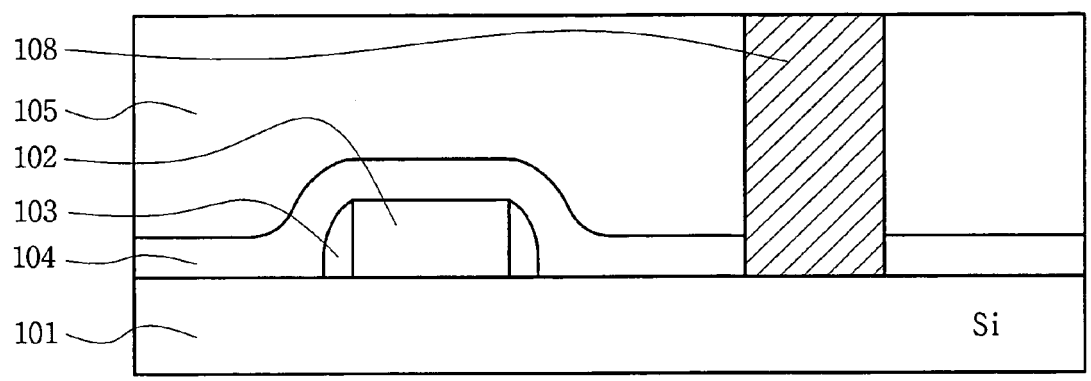

As shown in FIG. 4C, a single crystalline silicon layer 108 is grown in a region 107 defined by the photoresist pattern using selective epitaxial growth (SEG).

Figure 4D:
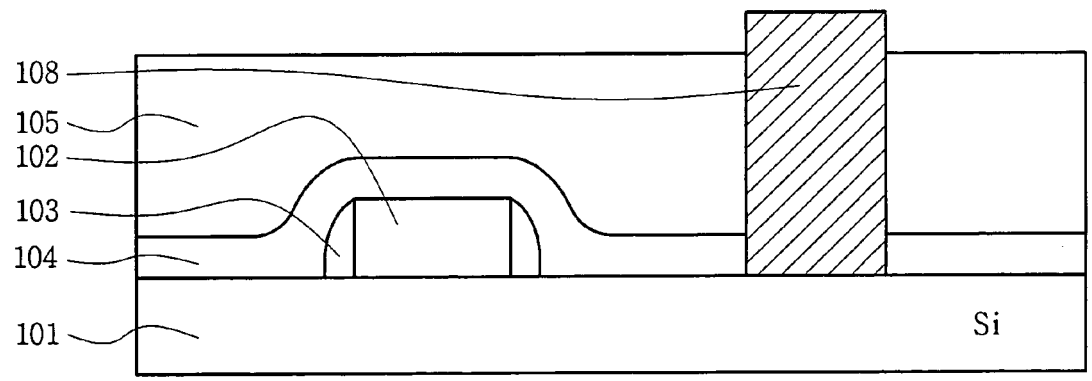

As shown in FIG. 4D, the first interlayer insulating film 105 surrounding the single crystalline silicon layer 108 is recessed by etching. This process may be referred to as an Inter-Layer Dielectric (ILD) recess process. Next, a pre-flow of silane (SiH4) is carried out on the first interlayer insulating film 105 and the single crystalline silicon layer 108.

Figure 4E:
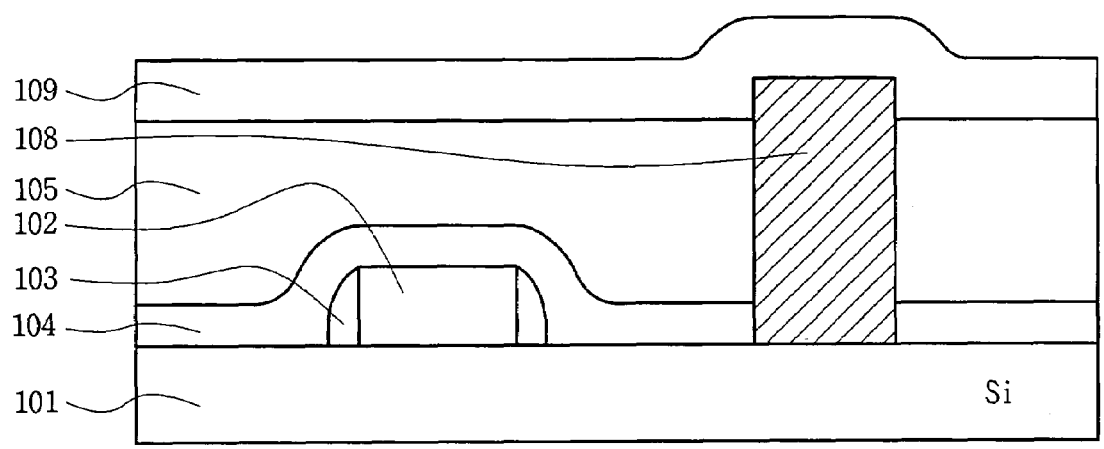

As shown in FIG. 4E, an amorphous silicon layer 109 is deposited on the first interlayer insulating film 105 and the single crystalline silicon layer 108 using a suitable method (e.g., a method such as sputtering, PECVD, or LPCVD). Before the amorphous silicon layer 109 is deposited, the process temperature is preferably set to a predetermined temperature. The predetermined temperature preferably ranges from about 450° C. to about 500° C. After the deposition process, the amorphous silicon layer 109 preferably covers a top surface of the single crystalline silicon layer 108 and partially covers the side surfaces of the single crystalline silicon layer.

An annealing process is then performed on the amorphous silicon layer 109 so that it becomes crystallized. Here, the single crystalline silicon layer 108 serves as a seed for crystallization of the amorphous silicon layer 109. The crystallized silicon layer 109 serves as channel silicon.

Depositing and annealing the amorphous silicon layer following the ILD recessing reduces the occurrence of the thinning phenomenon.

Figure 5:
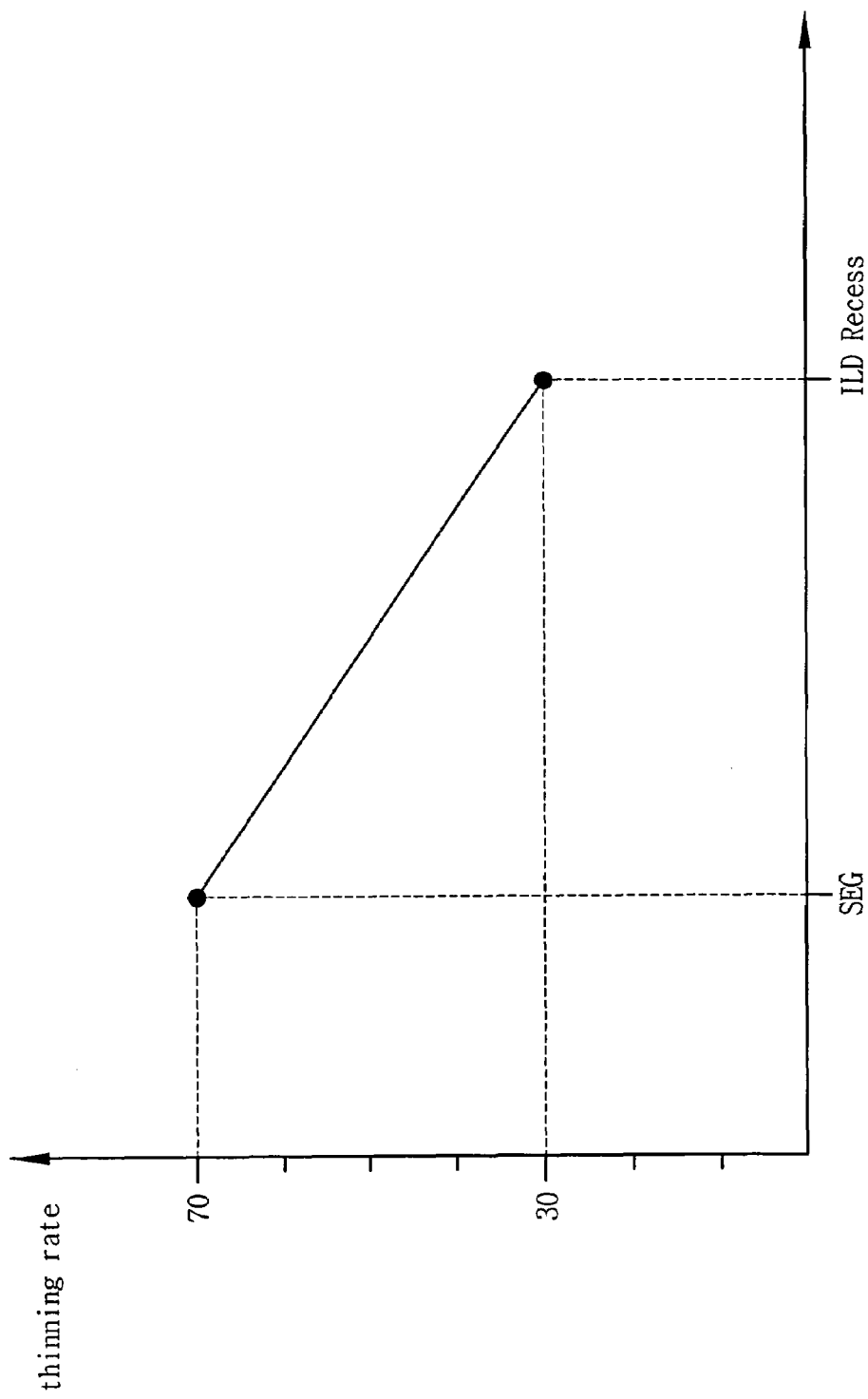
FIG. 5 is a graph illustrating the reduction in the thinning rate associated with some embodiments of the invention.

FIG. 5 is a graph illustrating the reduction in the thinning rate associated with some embodiments of the invention. In particular, FIG. 5 illustrates the reduction in thinning rate that can be achieved using the ILD recess process according to some embodiments of the invention. As shown in FIG. 5, the thinning rate for the crystallized silicon layer is about 70% when the conventional process is used. On the other hand, when the ILD recess method according to some embodiments of the invention is used, the thinning rate drops to about 30%. The thinning rate indicates to what extent the thickness of the crystallized silicon layer is reduced in the area around the single crystalline silicon layer. As shown in FIG. 5, the ILD recess process according to some embodiments of the invention reduces the thinning rate.

Figure 6:
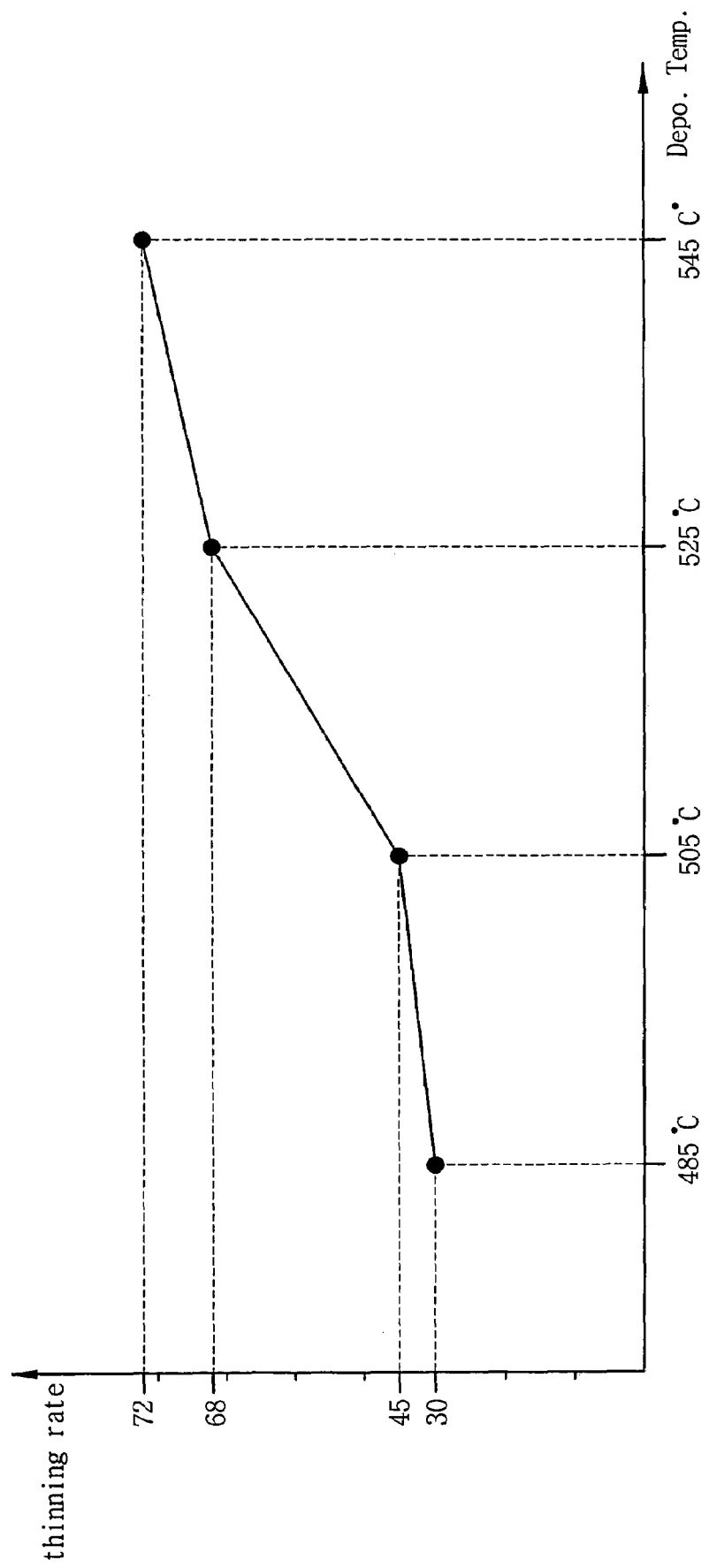
FIG. 6 is a graph illustrating the reduction in the thinning rate that is associated with some other embodiments of the invention.

FIG. 6 is a graph illustrating the reduction in the thinning rate that is associated with some other embodiments of the invention. In particular, FIG. 6 illustrates the thinning rate of the silicon layer as a function of the deposition temperature of the amorphous silicon layer. FIG. 6 illustrates that as the deposition temperature for the amorphous silicon layer is reduced, the thinning rate is reduced as well. Thus, according to other embodiments of the invention, it is possible to further reduce the thinning rate by using the ILD recess process described above in conjunction with lowering the deposition temperature of the amorphous silicon layer.

The invention has been described above using preferred exemplary embodiments. However, it is to be understood that the scope of the invention is not limited to the disclosed embodiments. To the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. A method of fabricating a static random access memory (SRAM), the method comprising:

selectively removing an insulating film;

growing a single crystalline silicon layer using selective epitaxial growth, the single crystalline silicon layer grown in an area from which the insulating film is removed;

recessing the insulating film to expose a portion of side surfaces of the single crystalline layer and to form a single crystalline silicon protrusion extending above a top surface of the insulating film;

depositing an amorphous silicon layer on the single crystalline silicon layer and the insulating film, the amorphous silicon layer completely covering a top surface and exposed side surfaces of the single crystalline silicon layer, wherein a top surface of the amorphous silicon layer directly covering the side surfaces of the single crystalline silicon protrusion is higher than a top surface of the amorphous silicon covering the insulating film; and performing an annealing process on the amorphous silicon layer to crystalline the amorphous silicon layer by using the single crystalline silicon layer as a seed, wherein the increased height of the top surface of the amorphous silicon covering the side surfaces of the single crystalline silicon protrusion prevents a thinning phenomenon of the amorphous silicon around the side surfaces of the single crystalline silicon layer during the annealing process.

2. The method of claim 1, wherein selectively removing the insulating film comprises selectively removing an interlayer dielectric film.

3. The method of claim 1, wherein depositing the amorphous silicon layer on the single crystal silicon layer and the insulating film comprises depositing the amorphous silicon layer at a temperature between about 450° C. to about 500° C.

4. The method of claim 1, wherein depositing an amorphous silicon layer on the single crystalline silicon layer and the insulating film comprises performing a process selected from the group consisting of sputtering, plasma enhanced chemical vapor deposition (PECVD), and low-pressure chemical vapor deposition (LPCVD).

5. A method of fabricating a static random access memory (SRAM), the method comprising:

forming a gate line on a semiconductor substrate;

forming a sidewall on a side surface of the gate line;

forming a first insulating film on a surface of the semiconductor substrate and on a surface of the gate line;

forming a second insulating film on a surface of the first insulating film;

etching the second insulating film and the first insulating film to form a contact region exposing the semiconductor substrate;

growing a single crystalline silicon layer in the contact region;

partially etching the second insulating film to reduce the height of the second insulating film relative to the single crystalline silicon layer;

carrying out a pre-flow of silane ($SiH_4$) on the second insulating film and the single crystalline silicon layer;

depositing an amorphous silicon layer on the second insulating film, on a top surface of the single crystalline silicon layer, and on side surfaces of the single crystalline layer that are exposed by the partial etching of the second insulating film; and crystallizing the amorphous silicon layer by performing an annealing process on the amorphous silicon layer using the single crystalline silicon layer as a seed so that the crystallized silicon layer serves as channel silicon.

6. The method of claim 5, wherein forming the insulating film comprises forming a etch stopping film.

7. The method of claim 5, wherein growing the single crystalline silicon layer comprises using selective epitaxial growth.

8. The method of claim 5, wherein forming the second insulating film comprises forming an interlayer dielectric (ILD) film.

9. The method of claim 5, wherein depositing the amorphous silicon layer comprises depositing the amorphous silicon layer at a process temperature between about 450° C. to about 500° C.

10. The method of claim 5, wherein depositing the amorphous silicon layer comprises performing a process selected from the group consisting of sputtering, plasma enhanced chemical vapor deposition (PECVD), and low-pressure chemical vapor deposition (LPCVD).

* * * * *

UNITED STATES PATENT AND TRADEMARK OFFICE
CERTIFICATE OF CORRECTION

PATENT NO. : 7,598,141 B2  Page 1 of 1
APPLICATION NO. : 11/261266
DATED : October 6, 2009
INVENTOR(S) : Chang-Hoon Lee et al.

It is certified that error appears in the above-identified patent and that said Letters Patent is hereby corrected as shown below:

Column 5, line 23, the word "crystalline" should read -- crystallize --;
Column 6, lines 20-21, the word "crystalline" should read -- crystalline silicon --.

Signed and Sealed this

Eighth Day of December, 2009

David J. Kappos
*Director of the United States Patent and Trademark Office*